(12) United States Patent
Kim et al.

(10) Patent No.: US 11,276,445 B2
(45) Date of Patent: *Mar. 15, 2022

(54) DATA STORAGE DEVICE AND OPERATING METHOD THEREOF

(71) Applicant: SK hynix Inc., Gyeonggi-do (KR)

(72) Inventors: Nack Hyun Kim, Gyeonggi-do (KR); Shin Hye Lee, Gyeonggi-do (KR); Min Kyu Lee, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/925,631

(22) Filed: Jul. 10, 2020

(65) Prior Publication Data

US 2020/0342925 A1 Oct. 29, 2020

Related U.S. Application Data

(63) Continuation of application No. 16/110,356, filed on Aug. 23, 2018, now Pat. No. 10,748,588.

(30) Foreign Application Priority Data

Jan. 11, 2018 (KR) .......................... 10-2018-0003753

(51) Int. Cl.
| | |
|---|---|
| *G11C 8/08* | (2006.01) |
| *G11C 7/24* | (2006.01) |
| *G11C 29/52* | (2006.01) |
| *G11C 7/10* | (2006.01) |

(Continued)

(52) U.S. Cl.
CPC .............. *G11C 8/08* (2013.01); *G06F 11/108* (2013.01); *G06F 11/1068* (2013.01); *G11C 7/1096* (2013.01); *G11C 7/24* (2013.01); *G11C 8/12* (2013.01); *G11C 29/52* (2013.01)

(58) Field of Classification Search
CPC .......... G01R 31/3177; G01R 31/31723; G01R 31/31703; G01R 31/31725; H03K 3/0372; H03K 19/21

See application file for complete search history.

(56) References Cited

U.S. PATENT DOCUMENTS

| | | | |
|---|---|---|---|
| 2013/0294168 A1* | 11/2013 | Shirakawa | G11C 16/0483 365/185.17 |
| 2015/0071018 A1* | 3/2015 | Kang | G11C 29/808 365/200 |
| 2016/0217858 A1* | 7/2016 | Navon | G11C 29/021 |

(Continued)

*Primary Examiner* — Thien Nguyen
(74) *Attorney, Agent, or Firm* — IP & T Group LLP

(57) ABSTRACT

A data storage device includes a nonvolatile memory device including dies including word line groups in which word lines are grouped; and a controller. The controller includes a word line health rating logic configured to determine a health rating of each word line and a health rating of each word line group based on state information on each of health rating factors associated with the word lines; a memory including a word line health rating table in which the health rating of each word line and the health rating of each word line group are stored; and a mapping logic configured to generate a management target logical super block by mapping one word line group having a lowest health rating and word line groups having a highest health rating, and generate a normal logical super block by mapping word line groups having intermediate health ratings.

17 Claims, 12 Drawing Sheets

(51) Int. Cl.
    *G06F 11/10* (2006.01)
    *G11C 8/12* (2006.01)

(56) References Cited

U.S. PATENT DOCUMENTS

2017/0372789 A1* 12/2017 Ray .................... G11C 16/0483
2018/0129559 A1* 5/2018 Kim .................... G06F 11/1048
2018/0217751 A1* 8/2018 Agarwal ............ G11C 16/3422

* cited by examiner

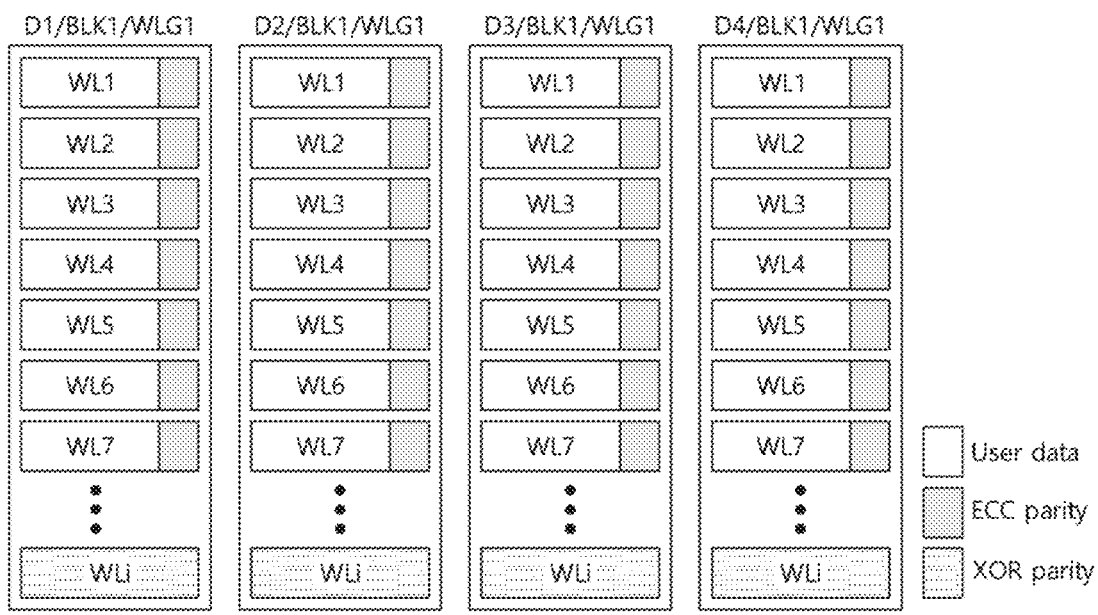

FIG.4A

| WL HR(Health Rating) Factors | Grading Standard per factor | | | |
|---|---|---|---|---|
| | 100 | 75 | 50 | 25 |
| E/W cycle | $\leq a1$ | $a1+1 \sim b1$ | $b1+1 \sim c1$ | $c1+1 \sim d1$ |
| read pass/fail | pass | - | - | fail |
| a number of fail bits | $\leq a2$ | $a2+1 \sim b2$ | $b2+1 \sim c2$ | $c2+1 \sim d2$ |
| program pass/fail | pass | - | - | fail |
| an amount of leakage current | $\leq a3$ | $a3+1 \sim b3$ | $b3+1 \sim c3$ | $c3+1 \sim d3$ |

FIG.4B $$\text{Rating number of WL} = \frac{\text{a sum of grades of factors}}{\text{a number of factors}}$$

FIG.4C

| WL HR(Health Rating) | A | B | C | D |
|---|---|---|---|---|
| Rating number range | 100 ~ 76 | 75 ~ 51 | 50 ~ 26 | 25 |

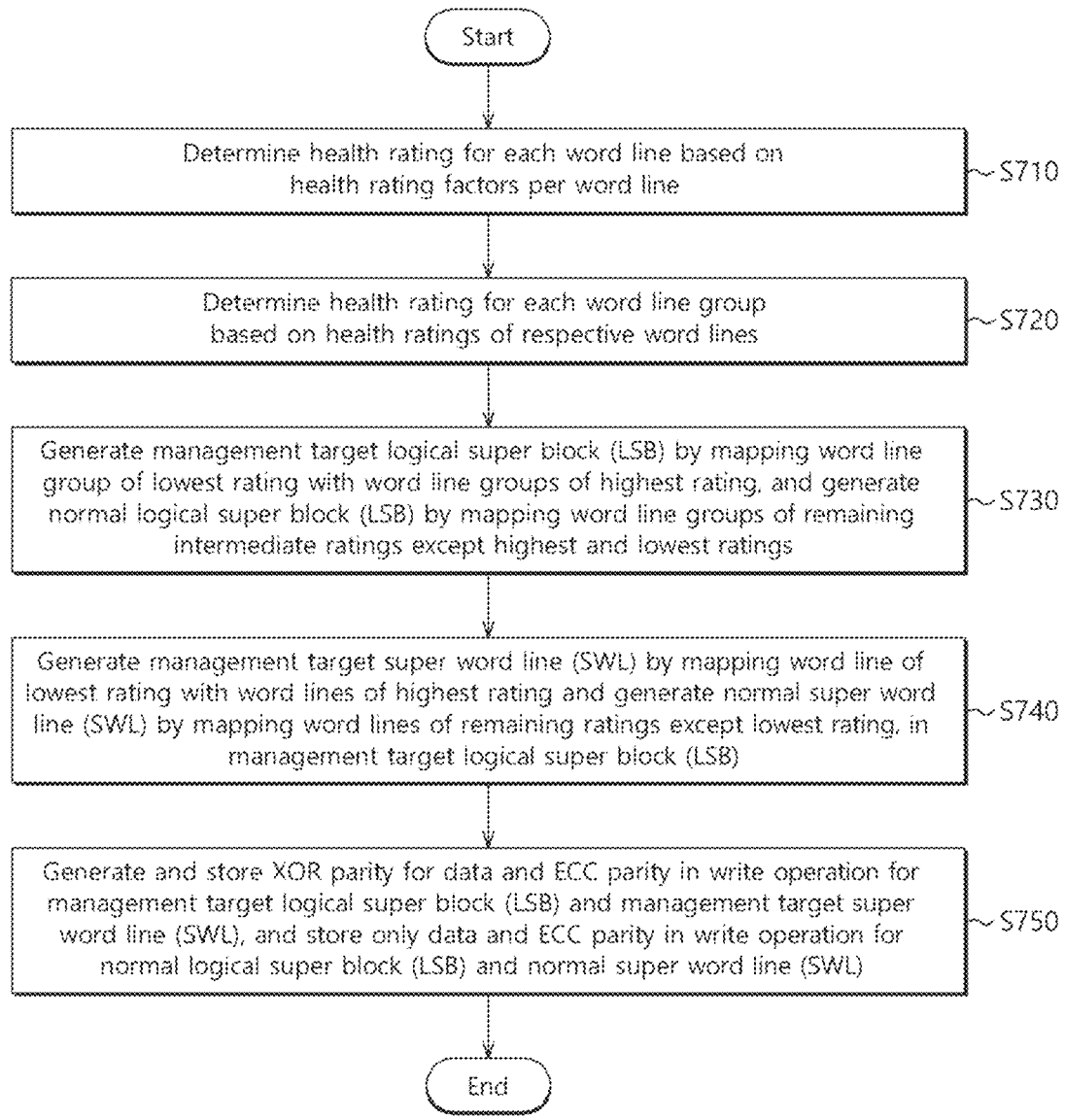

DATA STORAGE DEVICE AND OPERATING METHOD THEREOF

CROSS-REFERENCES TO RELATED APPLICATION

This application is a continuation of U.S. patent application Ser. No. 16/110,356 filed on Aug. 23, 2018, which claims benefits of priority of Korean Patent Application No. 10-2018-0003753 filed on Jan. 11, 2018. The disclosure of each of the foregoing application is incorporated herein by reference in its entirety.

BACKGROUND

1. Technical Field

Various embodiments generally relate to a semiconductor device, and, more particularly, to a data storage device and an operating method thereof.

2. Related Art

Recently, the paradigm for the computer environment has been changed into ubiquitous computing so that computer systems can be used anytime and anywhere. Due to this fact, the use of portable electronic devices such as mobile phones, digital cameras, and notebook computers has rapidly increased. In general, such portable electronic devices use a data storage device which uses a memory device. A data storage device is used to store data to be used in a portable electronic device.

A data storage device using a memory device provides advantages in that, since there is no mechanical driving part, stability and durability are excellent, an information access speed is high and power consumption is small. Data storage devices having such advantages include a universal serial bus (USB) memory device, memory cards having various interfaces, a universal flash storage (UFS) device, and a solid-state drive (SSD).

SUMMARY

Various embodiments are directed to a data storage device capable of effectively using storage space thereof, and an operating method thereof.

In an embodiment, a data storage device may include: a nonvolatile memory device including a plurality of dies including a plurality of word line groups in which a plurality of word lines are grouped; and a controller configured to control the nonvolatile memory device, the controller including a word line health rating logic configured to determine a health rating of each word line and a health rating of each word line group based on state information on each of health rating factors associated with the plurality of word lines; a memory including a word line health rating table in which the health rating of each word line and the health rating of each word line group determined by the word line health rating logic are stored; and a mapping logic configured to, by referring to the word line health rating table, generate a management target logical super block by mapping one word line group having a lowest health rating and a plurality of word line groups having a highest health rating in the respective dies, and generate a normal logical super block by mapping word line groups having intermediate health ratings in the respective dies.

In an embodiment, a method for operating a data storage device including a nonvolatile memory device including a plurality of dies including a plurality of word line groups in which a plurality of word lines are grouped and a controller which controls the nonvolatile memory device may include: determining a health rating of each word line and a health rating of each word line group based on state information on each of health rating factors associated with the plurality of word lines, by a word line health rating logic disposed in the controller; storing the health rating of each word line and the health rating of each word line group, in a word line health rating table included in a memory which is disposed in the controller; and generating a management target logical super block in which one word line group having a lowest health rating and a plurality of word line groups having a highest health rating in the respective dies are mapped, and generating a normal logical super block in which word line groups having intermediate health ratings in the respective dies are mapped, by a mapping logic which is disposed in the controller.

In an embodiment, a memory system may include: at least first and second memory devices each including memory cell groups; and a controller suitable for: determining damage-degrees of the memory cell groups in the respective memory devices; and controlling, during a writ operation, the memory devices not to store therein XOR parity data for the memory cell groups except for a management target logical super block including the memory cell group having a lowest damage-degree in the first memory device and the memory cell group having a highest damage-degree in the second memory device.

In accordance with the embodiments, as a management target super block is generated by mapping a word line of which health rating is low and a word line of which health rating is high and a normal super block is generated by mapping word lines of which health ratings are intermediate, it is possible to separately manage super blocks of which error occurrence rates are high.

Also, since XOR parity is additionally generated and stored when performing a write operation for the management target super block and XOR parity is not stored when performing a write operation for the normal super block, a space for storing XOR parity may be decreased, whereby a space in which user data is to be stored may be increased.

BRIEF DESCRIPTION OF THE DRAWINGS

FIG. 2C is a diagram illustrating a representation of an example in which user data, ECC parity and XOR parity are stored in a certain logical super block (LSB).

FIG. 3 is a diagram illustrating a representation of an example of a word line health rating table WL HR Table.

FIG. 4A is a diagram illustrating a representation of an example of word line health rating factors and a grading value.

FIG. 4B is a diagram illustrating a representation of an example of a method for determining the rating number of a word line based on the grades of the respective health rating factors of FIG. 4A.

FIG. 4C is a diagram illustrating a representation of an example of a rating number range per word line health rating.

FIG. 7 is a representation of an example of a flow chart to assist in the explanation of a method for operating a data storage device in accordance with an embodiment.

DETAILED DESCRIPTION

Hereinafter, a data storage device and an operating method thereof will be described below with reference to the accompanying drawings through various examples of embodiments.

Figure 1:
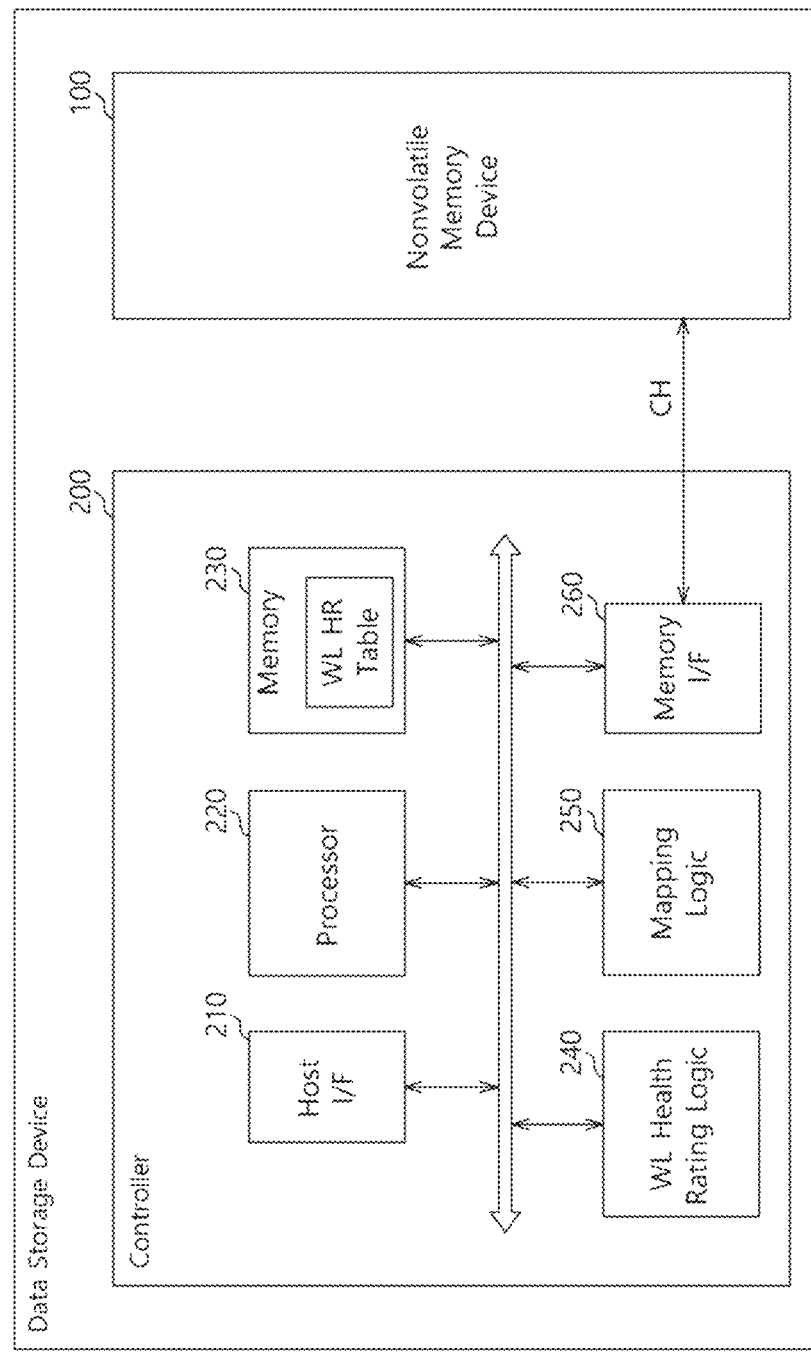
FIG. 1 is a block diagram illustrating a representation of an example of the configuration of a data storage device in accordance with an embodiment.

FIG. 1 is a block diagram illustrating a representation of an example of the configuration of a data storage device 10 in accordance with an embodiment. In the present embodiment, the data storage device 10 may store data to be accessed by a host device (not shown) such as a mobile phone, an MP3 player, a laptop computer, a desktop computer, a game player, a TV, an in-vehicle infotainment system, and so forth. The data storage device 10 may also be referred to as a memory system.

The data storage device 10 may be manufactured as any one of various kinds of storage devices according to a host interface meaning a transmission protocol with respect to the host device. For example, the data storage device 10 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The data storage device 10 may be manufactured as any one among various kinds of package types. For example, the data storage device 10 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

Referring to FIG. 1, the data storage device 10 may include a nonvolatile memory device 100 and a controller 200.

The nonvolatile memory device 100 may operate as the storage medium of the data storage device 10. The nonvolatile memory device 100 may be configured by any one of various types of nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, and a resistive random access memory (RERAM) using a transition metal compound, depending on memory cells.

While it is illustrated in FIG. 1 that the data storage device 10 includes one nonvolatile memory device 100, this is an illustration purpose only, and it is to be noted that the data storage device 10 may include a plurality of nonvolatile memory devices.

The nonvolatile memory device 100 may include a memory cell array which has a plurality of memory cells respectively disposed at regions where a plurality of bit lines (not shown) and a plurality of word lines (not shown) intersect with each other. The memory cell array may include a plurality of planes, and each plane may include a plurality of memory blocks. Each of the plurality of memory blocks may include a plurality of pages.

For example, each memory cell of the memory cell array may be a single level cell (SLC) storing one bit, a multi-level cell (MLC) capable of storing 2-bit data, a triple level cell (TLC) capable of storing 3-bit data or a quad level cell (QLC) capable of storing 4-bit data. The memory cell array may include at least ones among single level cells, multi-level cells, triple level cells and quad level cells. For example, the memory cell array may include memory cells of a 2-dimensional horizontal structure or memory cells of a 3-dimensional vertical structure.

Figure 2A:
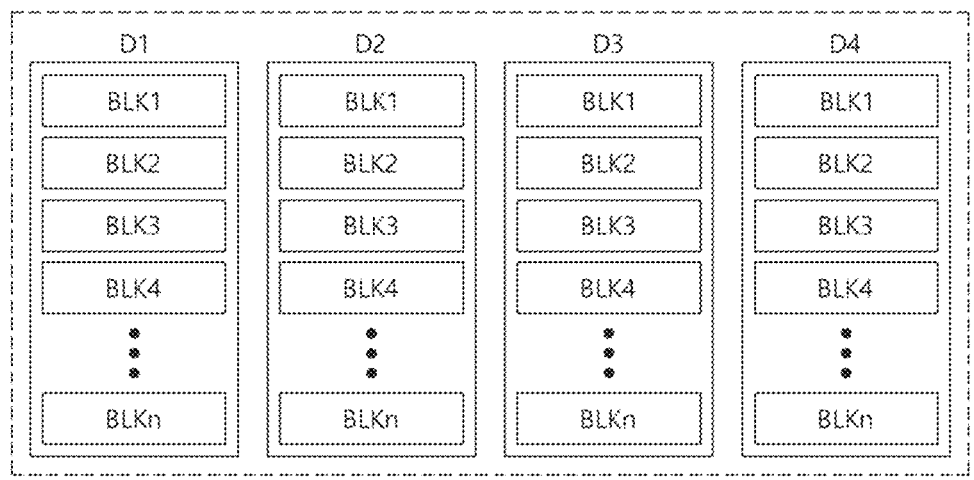
FIG. 2A is a diagram illustrating a representation of an example of the configuration of the nonvolatile memory device shown in FIG. 1.
Figure 2B:
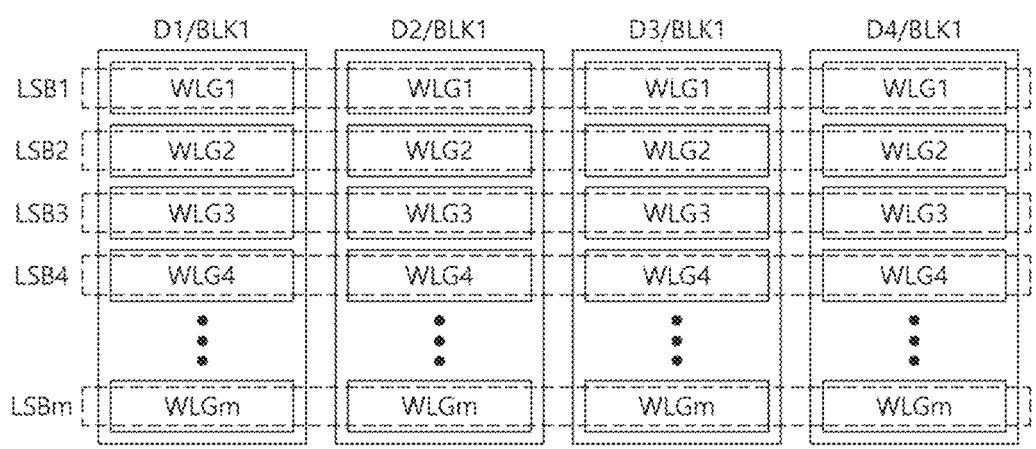
FIG. 2B is a diagram illustrating a representation of an example of a general logical super block (LSB).

FIG. 2A is a diagram illustrating a representation of an example of the configuration of the nonvolatile memory device shown in FIG. 1, FIG. 2B is a diagram illustrating a representation of an example of a general logical super block (LSB), and FIG. 2C is a diagram illustrating a representation of an example in which user data, ECC parity and XOR parity are stored in a certain logical super block (LSB). While it is illustrated in FIGS. 2a to 2c for the sake of convenience in explanation that the nonvolatile memory device 100 includes four dies D1 to D4, it is to be noted that the number of dies included in the nonvolatile memory device 100 is not specifically limited thereto.

Referring to FIG. 2A, the nonvolatile memory device 100 may include a plurality of dies, that is, first to fourth dies D1 to D4. Each of the dies D1 to D4 may include a plurality of memory blocks, for example, first to n^th memory blocks BLK1 to BLKn. Here, n may be an integer equal to or greater than 1. While not illustrated in FIG. 2A, each of the dies D1 to D4 may include a plurality of planes, and each of the planes may include a plurality of memory blocks BLK1 to BLKn. For the sake of convenience in explanation and simplification in illustration, illustration of planes is omitted in FIG. 2A.

Referring to FIG. 2B, the first memory blocks BLK1 of the respective first to fourth dies D1 to D4 may be grouped into one physical super block PSB. For the sake of convenience in explanation, a physical super block into which the first memory blocks BLK1 of the respective first to fourth dies D1 to D4 are grouped will be referred to as a first physical super block PSB1.

As shown in FIG. 2B, the first physical super block PSB1 may include a plurality of logical super blocks LSB, for example, first to m^th logical super blocks LSB1 to LSBm. Here, m may be an integer equal to or greater than 1. Each of the first to m^th logical super blocks LSB1 to LSBm may include a plurality of word line groups WLG each of which is configured by a plurality of word lines. For example, the first to m^th logical super blocks LSB1 to LSBm may include a plurality of first word line groups WLG1 to a plurality of m^th word line groups WLGm, respectively.

A configuration example of the first logical super block LSB1 is illustrated in FIG. 2C. While the first logical super block LSB1 is illustrated in FIG. 2C, the configurations of the remaining logical super blocks LSB, that is, the second to m^th logical super blocks LSB2 to LSBm may also be the same as the configuration illustrated in FIG. 2C.

As shown in FIG. 2C, the first logical super block LSB1 may include the first word line group WLG1 which is included in the first memory block BLK1 of each of the first to fourth dies D1 to D4. The first word line group WLG1 may include first to i^th word lines WL1 to WLi. Here, i may be an integer equal to or greater than 1.

In this disclosure, the expression that a word line stores data will be interpreted as that memory cells coupled to the word line stores data. For example, in the plurality of first word line groups WLG1 included in the first logical super block LSB1, there may be stored user data, ECC parity for the user data and XOR parity for the user data and the ECC parity. While it is illustrated in FIG. 2C that XOR parity is stored in each of the i^th word lines WLi of the respective first word line groups WLG1, it is to be noted that a location and the number of word lines where XOR parity is stored in the first word line groups WLG1 are not specifically limited thereto. The XOR parity may be used for additional correction of an error included in user data when correction of the error fails through an ECC parity during a read operation, and may be generated by XORing corresponding bits with respect to the user data and the ECC parity stored by each word line during a program operation of the user data.

In order to improve recovery capability for the user data stored in the first logical super block LSB1, the number of word lines to be XORed should be decreased. Accordingly, the number of XOR parity to be generated increases, and a space for storing the user data in the first logical super block LSB1 be reduced by a size of space in which the increased number of XOR parity.

In accordance with an embodiment of the present invention, the XOR parity may be generated not for all of word lines but for a partial group of word lines to which error correction through the ECC parity are expected as difficult among all of the word lines.

Referring back to FIG. 1, the controller 200 may include a host interface (Host I/F) 210, a processor 220, a memory 230, a word line health rating logic 240, a mapping logic 250 and a memory interface (Memory I/F) 260.

The host interface 210 may interface the host device (not shown) and the data storage device 10. For example, the host interface 210 may communicate with the host device by using any one among standard transmission protocols such as universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI) and PCI express (PCI-E) protocols.

The processor 220 may be configured by a micro control unit (MCU) or a central processing unit (CPU). The processor 220 may process a command transmitted from the host device. In order to process the command, the processor 220 may drive an instruction or algorithm of a code type, that is, a software, loaded in the memory 230, and may control internal function blocks and the nonvolatile memory device 100.

The memory 230 may be configured by a random-access memory such as a dynamic random-access memory (DRAM) or a static random-access memory (SRAM). The memory 230 may store a software to be driven by the processor 220. Also, the memory 230 may store the data needed to drive the software. Namely, the memory 230 may operate as a working memory of the processor 220.

The memory 230 may temporarily store data to be transmitted from the host device to the nonvolatile memory device 100 or data to be read from the nonvolatile memory device 100 and be then transmitted to the host device. In other words, the memory 230 may operate as a buffer memory.

The memory 230 may include a word line health rating table WL HR Table. While health rating information on all word lines included in the nonvolatile memory device 100 may be stored in the word line health rating table WL HR Table, it is to be noted that the embodiment is not specifically limited thereto. For example, health rating information on all word lines of the nonvolatile memory device 100 may be stored in the nonvolatile memory device 100, and only health rating information on the word lines of a memory block which is currently being used may be loaded in the word line health rating table WL HR Table of the memory 230.

FIG. 3 is a diagram illustrating a representation of an example of the configuration of the word line health rating table WL HR Table. Referring to FIG. 3, the word line health rating table WL HR Table may include a health rating HR for each of the first to m^th word line groups WLG1 to WLGm included in each of the memory blocks BLK1 to BLKn of each of the dies D1 to D4 (see FIG. 2A) and a health rating HR for each of the first to i^th word lines WL1 to WLi included in each of the first to m^th word line groups WLG1 to WLGm. For example, the health rating HR (for example, 'A') of the first word line group WLG1 may correspond to the average rating of the health ratings HR of the first to i^th word lines WL1 to WLi included in the first word line group WLG1.

The word line health rating logic 240 may determine a health rating for each of the word lines of the nonvolatile memory device 100, and may store the health rating determined per word line, in the word line health rating table WL HR Table. The word line health rating logic 240 may determine and store the health rating of a word line group based on the health ratings of word lines included in the word line group.

FIG. 4A is a diagram illustrating a representation of an example of word line health rating factors and a grading value, FIG. 4B is a diagram illustrating a representation of an example of a method for determining the rating number of a word line based on the grades of the health rating factors of FIG. 4A, and FIG. 4C is a diagram illustrating a representation of an example of a rating number range per word line health rating.

The word line health rating logic 240 may determine a health rating for each word line, by using the word line health rating factors shown in FIG. 4A. In FIG. 4A, the word line health rating factors include an erase/write cycle (E/W cycle) of a memory block including the word line, a read pass/fail of memory cells coupled to the word line, a number of fail bits related to the memory cells, a program pass/fail of the memory cells and an amount of leakage current of the memory cells. However, it is to be noted that information capable of being used as the word line health rating factors is not specifically limited thereto. Since the technique of checking state information such as an erase/write cycle (E/W cycle), a read pass/fail, a number of fail bits, a program pass/fail and an amount of leakage current is generally known in the art to which the disclosure pertains, detailed descriptions therefor will be omitted herein.

Referring to FIG. 4A, while grading values are set as '100', '75', '50' and '25', this is nothing but a mere illustration. It is apparent to those skilled in the art that grading ranges may be not necessarily converted into a numerical values and may be converted into various forms. Also, while the grading ranges are divided into four ranges in the embodiment, it is to be noted that the number of ranges is not specifically limited thereto.

For example, the erase/write cycle may be divided into a first range equal to or less than a1, a second range between a1+1 and b1, a third range between b1+1 and c1 and a fourth range between c1+1 and d1, and a grade may gradually decrease from the first range to the fourth range. Here, a1, b1, c1 and d1 may be integers, and $a1<b1<c1<d1$.

Each of the read pass/fail and the program pass/fail may include only two ranges of pass and fail. Pass may correspond to a grading value of '100', and fail may correspond to a grading value of '25'.

The number of fail bits may be divided into a first range equal to or less than a2, a second range between a2+1 and b2, a third range between b2+1 and c2 and a fourth range between c2+1 and d2, and a grade may gradually decrease from the first range to the fourth range. Here, a2, b2, c2 and d2 may be integers, and $a2<b2<c2<d2$.

The amount of leakage current may be divided into a first range equal to or less than a3, a second range between a3+1 and b3, a third range between b3+1 and c3 and a fourth range between c3+1 and d3, and a grade may gradually decrease from the first range to the fourth range. Here, a3, b3, c3 and d3 may include integers and decimals, and $a3<b3<c3<d3$.

The word line health rating logic 240 may calculate a rating number of a specific word line, by using the equation shown in FIG. 4B. For example, when assuming that the grades of an erase/write cycle for a memory block in which the specific word line is included, a read pass/fail of memory cells coupled to the specific word line, a program pass/fail of the memory cells, a number of fail bits related with the memory cells and an amount of leakage current of the memory cells are 75, 100, 100, 75 and 75, respectively, the rating number of the specific word line may be 85. The word line health rating logic 240 may determine the health rating HR of the specific word line as 'A' by referring to a table showing relationship between the health rating and a rating number range shown in FIG. 4C.

In this way, the word line health rating logic 240 may determine a health rating HR for each of the word lines of the nonvolatile memory device 100, and may store the determined health rating in the word line health rating table WL HR Table.

The word line health rating logic 240 may determine and store the average rating of the health ratings of the word lines included in each word line group WLG, as the health rating of the corresponding word line group WLG. However, the word line health rating logic 240 may determine and store the health rating HR of a word line group WLG as a health rating 'D', that is, a lowest health rating when the word line group WLG includes at least one word line of a health rating 'D,' that is, a lowest health rating.

The mapping logic 250 may generate a management target logical super block LSB by mapping one-word line group WLG which has a lowest health rating and a plurality of word line groups WLG which have a highest health rating, by referring to the word line health rating table WL HR Table. The mapping logic 250 may generate a normal logical super block LSB by mapping word line groups WLG which have intermediate health ratings except the highest health rating and the lowest health rating, by referring to the word line health rating table WL HR Table.

Figure 5:
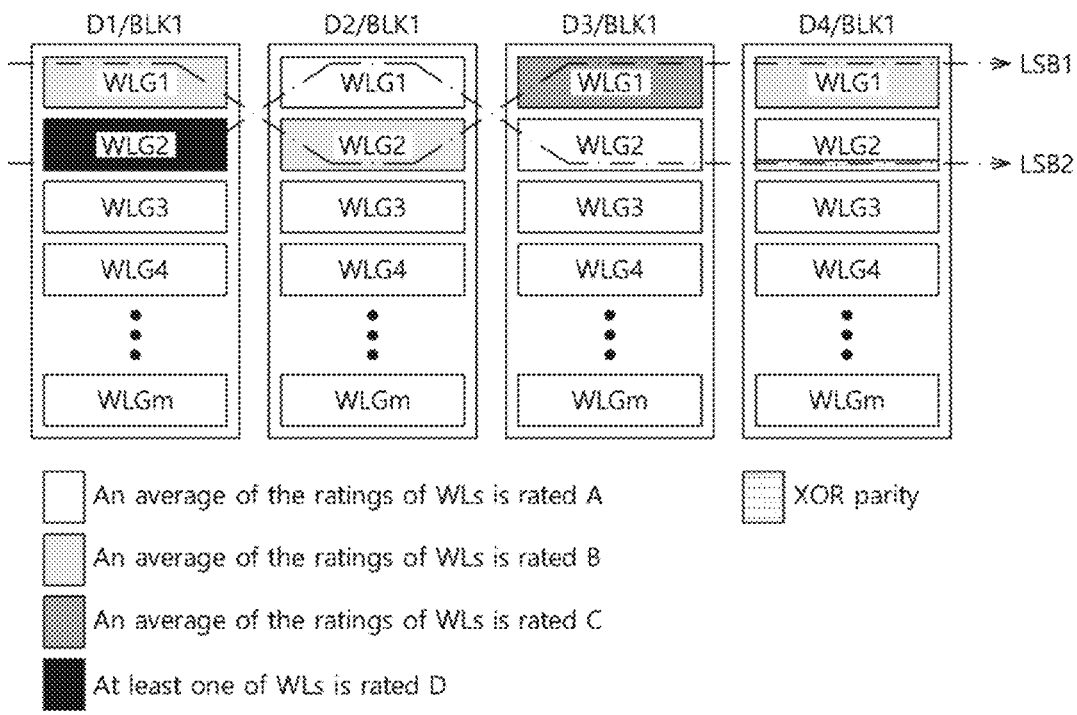
FIG. 5 is a diagram illustrating a representation of an example of generating a logical super block by mapping word line groups in accordance with the embodiment.

FIG. 5 is a diagram illustrating a representation of an example of generating a logical super block by mapping word line groups in accordance with the embodiment. For the sake of convenience in explanation, only two logical super blocks are illustrated in FIG. 5.

Referring to FIG. 5, the mapping logic 250 may generate a second logical super block LSB2 by mapping the second word line group WLG2 which is included in the first memory block BLK1 of the first die D1 and has the lowest health rating, that is, the health rating 'D', and the first word line group WLG1, the second word line group WLG2 and the second word line group WLG2 which are included in the first memory blocks BLK1 of the second to fourth dies D2 to D4, respectively, and have the highest health rating, that is, the health rating 'A'. Since the second logical super block LSB2 includes a word line group of the lowest health rating (that is, the second word line group WLG2 of the first memory block BLK1 of the first die D1), it may be classified into a management target logical super block.

The mapping logic 250 may generate a first logical super block LSB1 by mapping the first word line group WLG1, the second word line group WLG2, the first word line group WLG1 and the first word line group WLG1 of the first to fourth dies D1 to D4, respectively, which have intermediate health ratings except the highest health rating and the lowest health rating, that is, health ratings 'B' and 'C'. Since the first logical super block LSB1 does not include a word line group WLG of the lowest health rating, it may be classified into a normal logical super block.

In a write operation for the second logical super block LSB2 being a management target logical super block, the processor 220 may control XOR parity for data to be stored in the second logical super block LSB2 and the ECC parity of the data, to be generated and stored in at least one word line included in at least one word line group (for example, the second word line group WLG2 of the fourth die D4) among the word line groups WLG included in the second logical super block LSB2. In a write operation for the first logical super block LSB1 being a normal logical super block, the processor 220 may control XOR parity for data to be stored in the first logical super block LSB1 and the ECC parity of the data not to be generated and stored.

That is, the processor 220 may classify the logical super blocks LSB mapped by the mapping logic 250, into a management target logical super block LSB and a normal logical super block LSB, may generate and store XOR parity when performing a write operation for the management target logical super block LSB, and may not store XOR parity when performing a write operation for the normal logical super block LSB. In this way, by not generating and storing XOR parity in all write operations but selectively generating and storing XOR parity depending on the health rating of a logical super block LSB, a space in which XOR parity is to be stored may be reduced, and thus, a space capable of storing user data may be increased.

The mapping logic 250 may generate a management target super word line SWL by mapping one-word line WL which has the lowest health rating and a plurality of word lines WL which have the highest health rating, among the word lines WL1 to WLi of each of the dies D1 to D4 included in the management target logical super block LSB. The mapping logic 250 may generate a normal super word line SWL by mapping word lines WL which have the intermediate health ratings except the highest health rating and the lowest health rating in the word lines WL1 to WLi of each of the dies D1 to D4 included in the management target logical super block LSB. That is, the mapping logic 250 may generate the management target super word line SWL and the normal super word line SWL from the word line groups WLG of the management target logical super block LSB.

Figure 6A:
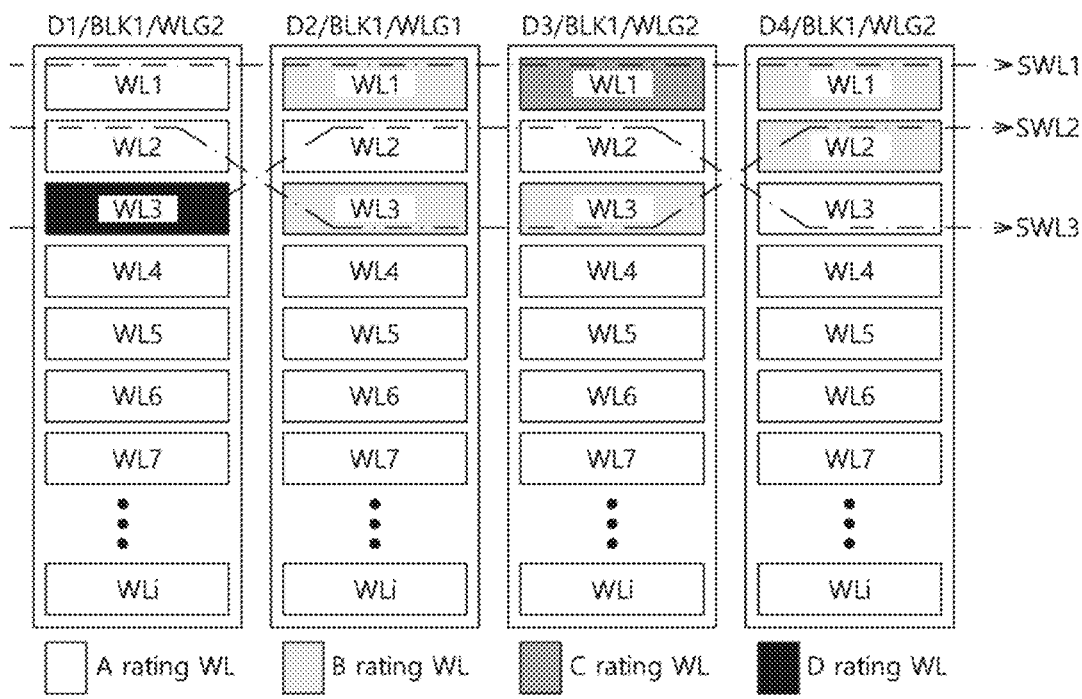
FIG. 6A is a diagram illustrating a representation of an example of generating a super word line by mapping word lines in the management target logical super block of FIG. 5.
Figure 6B:
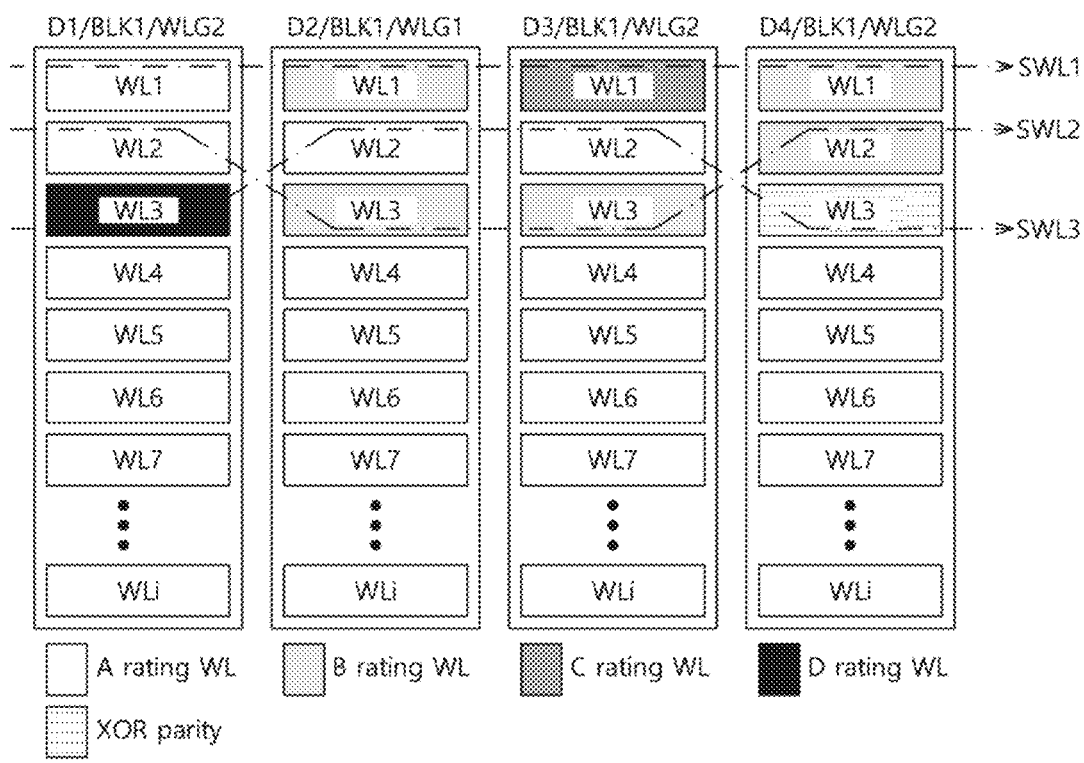
FIG. 6B is a diagram illustrating a representation of an example of generating and storing XOR parity in a write operation for the management target super word line of FIG. 6A.

FIG. 6A is a diagram illustrating a representation of an example of generating a super word line by mapping word lines in the management target logical super block of FIG. 5, and FIG. 6B is a diagram illustrating a representation of an example of generating and storing XOR parity in a write operation for the management target super word line of FIG. 6A.

Referring to FIG. 6A, the mapping logic 250 may generate a third super word line SWL3 in the second logical super block LSB2 being the management target logical super block by mapping a third word line WL3 which is included in the second word line group WLG2 of the first memory block BLK1 of the first die D1 and has the lowest health rating, that is, the health rating 'D', with the second word line WL2 of the first word line group WLG1 of the second die D2, the second word line WL2 of the second word line group WLG2 of the third die D3 and the third word line WL3 of the second word line group WLG2 of the fourth die D4 which have the highest health rating, that is, the health rating 'A'. Since the third super word line SWL3 includes a word line of the lowest health rating (that is, the third word line WL3 of the second word line group WLG2 of the first memory block BLK1 of the first die D1), it may be classified into a management target super word line.

The mapping logic 250 may generate a first super word line SWL1 by mapping the first word lines WL1 of the first to fourth dies D1 to D4 which have the health ratings 'A', 'B', 'C' and 'B,' respectively, and may generate a second super word line SWL2 by mapping the second word line WL2, the third word line WL3, the third word line WL3 and the second word line WL2 of the first to fourth dies D1 to D4, respectively, which have the health ratings 'A', 'B', 'B' and 'B,' respectively. Since the first and second super word lines SWL1 and SWL2 do not include a word line of the lowest health rating, that is, the health rating 'D,' they may be classified into normal super word lines.

As shown in FIG. 6B, in a write operation for the third super word line SWL3 being the management target super word line, the processor 220 may control XOR parity for data to be stored in the third super word line SWL3 and the ECC parity of the data, to be generated and stored in at least one-word line (for example, the third word line WL3 of the fourth die D4) among the word lines WL included in the third super word line SWL3. In write operations for the first and second super word lines SWL1 and SWL2 being normal super word lines, the processor 220 may control XOR parity for data to be stored in the first and second super word lines SWL1 and SWL2 and the ECC parity of the data, not to be stored.

FIG. 7 is a representation of an example of a flow chart to assist in the explanation of a method for operating the data storage device 10 in accordance with an embodiment. In explaining the method for operating the data storage device 10 in accordance with the embodiment, with reference to FIG. 7, reference may be made to FIGS. 1 to 6B.

At step S710, the word line health rating logic 240 of the controller 200 may determine a health rating for each word line based on state information on each of health rating factors for the word lines included in the nonvolatile memory device 100. The word line health rating logic 240 may perform the operation of determining a health rating for each word line, by the control of the processor 220. Since detailed descriptions were made above for the kinds of the health rating factors and determination of a health rating for each word line by using the health rating factors, further descriptions thereof will be omitted herein.

At step S720, the word line health rating logic 240 may determine a health rating for each of the word line groups WLG1 to WLGi included in each of the memory blocks BLK1 to BLKn of each of the dies D1 to D4 of the nonvolatile memory device 100, based on the health rating for each word line determined at the step S710. The health rating of each word line group WLG may correspond to the average of the health ratings of the word lines WL included in the corresponding word line group WLG. The word line health rating logic 240 may store a health rating for each word line WL determined at the step S710 and a health rating for each word line group WLG determined at the step S720, in the word line health rating table WL HR Table of the memory 230.

At step S730, the mapping logic 250 of the controller 200 may generate a management target logical super block LSB by mapping one-word line group WLG which has a lowest health rating and a plurality of word line groups WLG which have a highest health rating, by referring to the word line health rating table WL HR Table of the memory 230. The mapping logic 250 may generate a normal logical super block LSB by mapping word line groups WLG which have intermediate health ratings except the highest health rating and the lowest health rating. The mapping logic 250 may generate a logical super block by mapping word line groups by the control of the processor 220. The logical super block may include one-word line group per each of the dies D1 to D4.

At step S740, the mapping logic 250 may generate a management target super word line SWL by mapping one word line WL which has the lowest health rating, that is, the health rating 'D,' and a plurality of word lines WL which have the highest health rating, that is, the health rating 'A,' among the word lines WL of each of the dies D1 to D4 included in the management target logical super block LSB. The mapping logic 250 may generate a normal super word line SWL by mapping word lines WL which have health ratings except the lowest health rating. The mapping logic 250 may generate a super word line through mapping word lines by the control of the processor 220. The super word line may include one-word line per each of the dies D1 to D4.

At step S750, in a write operation for the management target logical super block LSB, the processor 220 may generate XOR parity for data to be stored in the management target logical super block LSB and the ECC parity of the data, and may control the XOR parity to be stored in at least one word line included in at least one word line group WLG among the word line groups WLG included in the management target logical super block LSB.

Also, in a write operation for the management target super word line SWL, the processor 220 may generate XOR parity for data to be stored in the management target super word line SWL and the ECC parity of the data, and may control the XOR parity to be stored in at least one-word line included in the management target super word line SWL.

In a write operation for the normal logical super block LSB, the processor 220 may control XOR parity for data to be stored in the normal logical super block LSB and the ECC parity of the data, not to be stored. Further, in a write operation for the normal super word line SWL, the processor 220 may control XOR parity for data to be stored in the normal super word line SWL and the ECC parity of the data, not to be stored.

Referring back to FIG. 1, the memory interface 260 may control the nonvolatile memory device 100 according to the control of the processor 220. The memory interface 260 may also be referred to as a memory controller. The memory interface 260 may provide control signals to the nonvolatile memory device 100. The control signals may include a command, an address and so forth, for controlling the nonvolatile memory device 100. The memory interface 260 may provide data to the nonvolatile memory device 100 or may be provided with data from the nonvolatile memory device 100. The memory interface 260 may be coupled with the nonvolatile memory device 100 through a channel CH including one or more signal lines.

Figure 8:
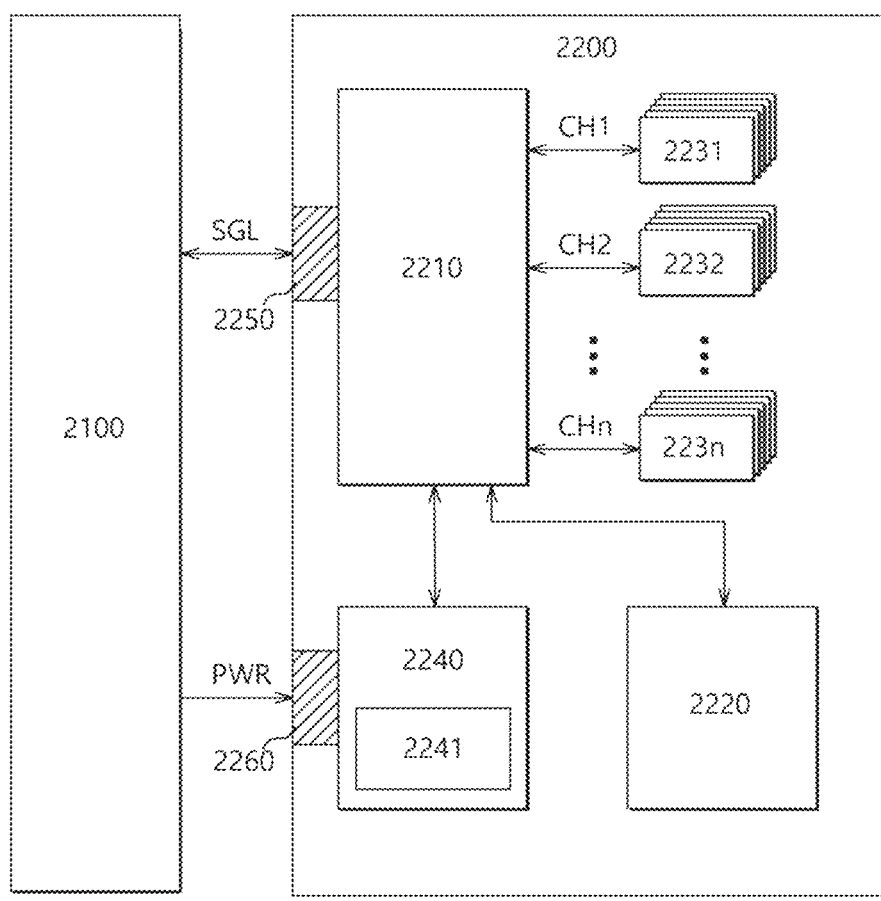
FIG. 8 is a diagram illustrating an example of a data processing system including a solid-state drive (SSD) in accordance with an embodiment.

FIG. 8 is a diagram illustrating an example of a data processing system including a solid-state drive (SSD) in accordance with an embodiment. Referring to FIG. 8, a data processing system 2000 may include a host apparatus 2100 and a SSD 2200.

The SSD 2200 may include a controller 2210, a buffer memory device 2220, non-volatile memory devices 2231 to 223n, a power supply 2240, a signal connector 2250, and a power connector 2260.

The controller 2210 may control an overall operation of the SSD 2220.

The buffer memory device 2220 may temporarily store data to be stored in the nonvolatile memory devices 2231 to 223n. The buffer memory device 2220 may temporarily store data read from the nonvolatile memory devices 2231 to 223n. The data temporarily stored in the buffer memory device 2220 may be transmitted to the host apparatus 2100 or the nonvolatile memory devices 2231 to 223n according to control of the controller 2210.

The nonvolatile memory devices 2231 to 223n may be used as a storage medium of the SSD 2200. The nonvolatile memory devices 2231 to 223n may be coupled to the controller 2210 through a plurality of channels CH1 to CHn. One or more nonvolatile memory devices may be coupled to one channel. The nonvolatile memory devices coupled to the one channel may be coupled to the same signal bus and the same data bus.

The power supply 2240 may provide power PWR input through the power connector 2260 to the inside of the SSD 2200. The power supply 2240 may include an auxiliary power supply 2241. The auxiliary power supply 2241 may supply the power so that the SSD 2200 is normally terminated even when sudden power-off occurs. The auxiliary power supply 2241 may include large capacity capacitors capable of charging the power PWR.

The controller 2210 may exchange a signal SGL with the host apparatus 2100 through the signal connector 2250. The signal SGL may include a command, an address, data, and the like. The signal connector 2250 may be configured of various types of connectors according to an interfacing method between the host apparatus 2100 and the SSD 2200.

Figure 9:
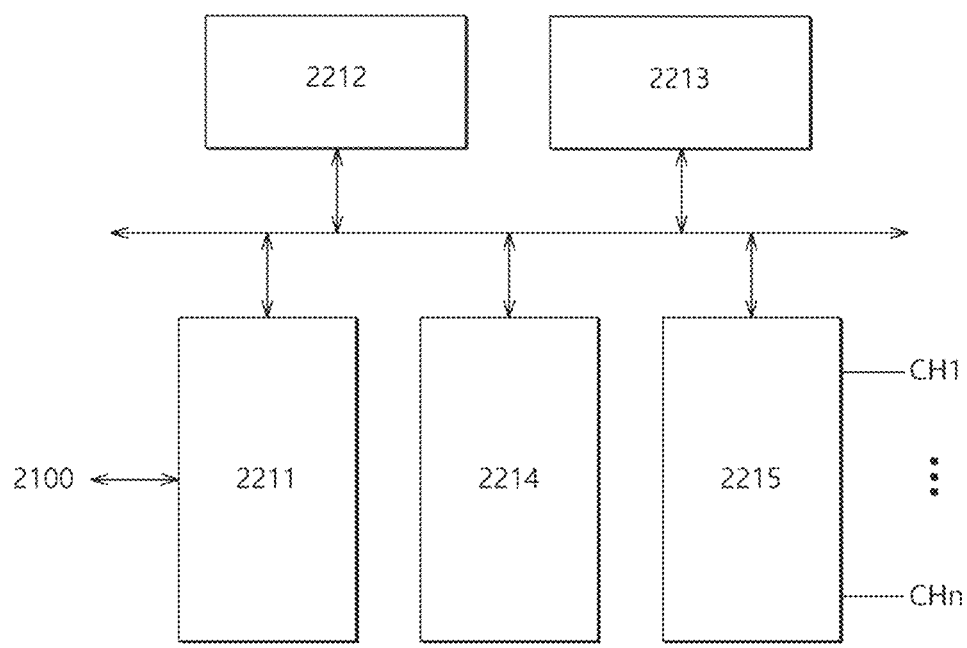
FIG. 9 is a diagram illustrating an example of a controller illustrated in FIG. 7.

FIG. 9 is a diagram illustrating an example of the controller 2210 of FIG. 8. Referring to FIG. 9, the controller 2210 may include a host interface unit 2211, a control unit 2212, a random-access memory (RAM) 2213, an error correction code (ECC) unit 2214, and a memory interface unit 2215.

The host interface unit 2211 may perform interfacing between the host apparatus 2100 and the SSD 2200 according to a protocol of the host apparatus 2100. For example, the host interface unit 2211 may communicate with the host apparatus 2100 through any one among a secure digital protocol, a universal serial bus (USB) protocol, a multimedia card (MMC) protocol, an embedded MMC (eMMC) protocol, a personal computer memory card international association (PCMCIA) protocol, a parallel advanced technology attachment (DATA) protocol, a serial advanced technology attachment (SATA) protocol, a small computer system interface (SCSI) protocol, a serial attached SCSI (SAS) protocol, a peripheral component interconnection (PCI) protocol, a PCI Express (PCI-E) protocol, and a universal flash storage (UFS) protocol. The host interface unit 2211 may perform a disc emulation function that the host apparatus 2100 recognizes the SSD 2200 as a general-purpose data storage apparatus, for example, a hard disc drive HDD.

The control unit 2212 may analyze and process the signal SGL input from the host apparatus 2100. The control unit 2212 may control operations of internal functional blocks according to firmware and/or software for driving the SDD 2200. The RAM 2213 may be operated as a working memory for driving the firmware or software.

The ECC unit 2214 may generate parity data for the data to be transferred to the nonvolatile memory devices 2231 to 223n. The generated parity data may be stored in the nonvolatile memory devices 2231 to 223n together with the data. The ECC unit 2214 may detect errors for data read from the nonvolatile memory devices 2231 to 223n based on the parity data. When detected errors are within a correctable range, the ECC unit 2214 may correct the detected errors.

The memory interface unit 2215 may provide a control signal such as a command and an address to the nonvolatile memory devices 2231 to 223n according to control of the control unit 2212. The memory interface unit 2215 may exchange data with the nonvolatile memory devices 2231 to 223n according to control of the control unit 2212. For example, the memory interface unit 2215 may provide data stored in the buffer memory device 2220 to the nonvolatile memory devices 2231 to 223n or provide data read from the nonvolatile memory devices 2231 to 223n to the buffer memory device 2220.

Figure 10:
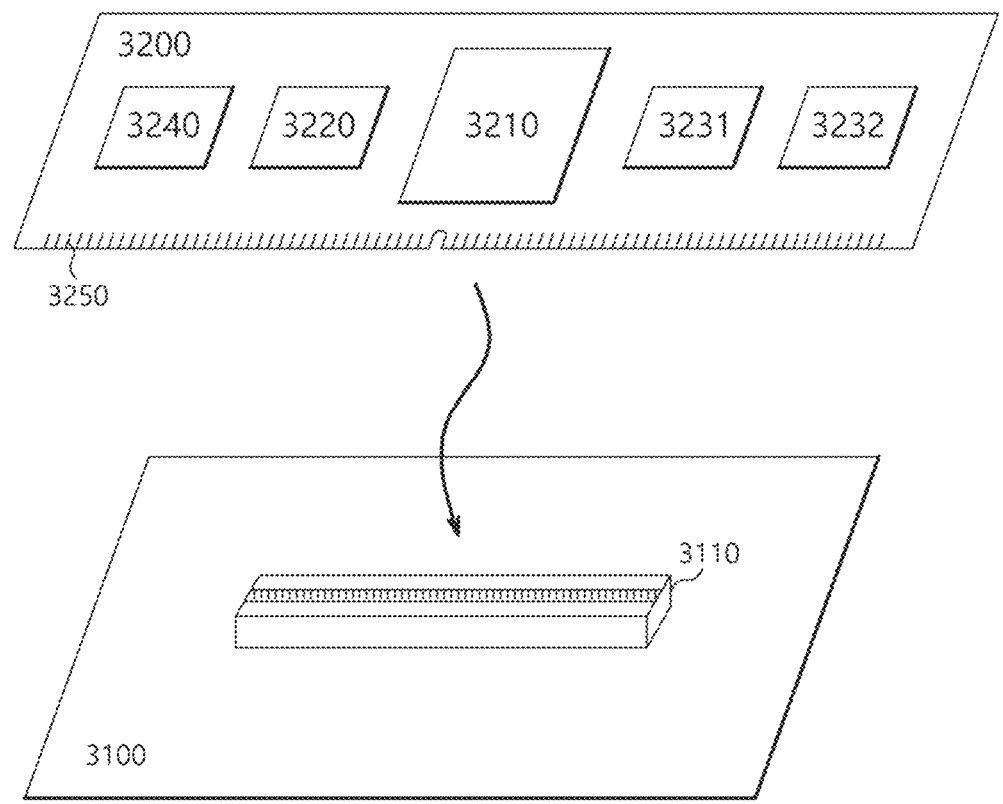
FIG. 10 is a diagram illustrating an example of a data processing system including a data storage apparatus in accordance with an embodiment.

FIG. 10 is a diagram illustrating an example of a data processing system including a data storage apparatus in accordance with an embodiment. Referring to FIG. 10, a data processing system 3000 may include a host apparatus 3100 and a data storage apparatus 3200.

The host apparatus 3100 may be configured in a board form such as a printed circuit board (PCB). Although not shown in FIG. 10, the host apparatus 3100 may include internal functional blocks configured to perform functions of the host apparatus 3100.

The host apparatus 3100 may include a connection terminal 3110 such as a socket, a slot, or a connector. The data storage apparatus 3200 may be mounted on the connection terminal 3110.

The data storage apparatus 3200 may be configured in a board form such as a PCB. The data storage apparatus 3200 may refer to a memory module or a memory card. The data storage apparatus 3200 may include a controller 3210, a buffer memory device 3220, nonvolatile memory devices 3231 to 3232, a power management integrated circuit (PMIC) 3240, and a connection terminal 3250.

The controller 3210 may control an overall operation of the data storage apparatus 3200. The controller 3210 may be configured to have the same configuration as the controller 2210 illustrated in FIG. 9.

The buffer memory device 3220 may temporarily store data to be stored in the nonvolatile memory devices 3231 and 3232. The buffer memory device 3220 may temporarily store data read from the nonvolatile memory devices 3231 and 3232. The data temporarily stored in the buffer memory device 3220 may be transmitted to the host apparatus 3100 or the nonvolatile memory devices 3231 and 3232 according to control of the controller 3210.

The nonvolatile memory devices 3231 and 3232 may be used as a storage medium of the data storage apparatus 3200.

The PMIC 3240 may provide power input through the connection terminal 3250 to the inside of the data storage apparatus 3200. The PMIC 3240 may manage the power of the data storage apparatus 3200 according to control of the controller 3210.

The connection terminal 3250 may be coupled to the connection terminal 3110 of the host apparatus 3100. A signal such as a command, an address, and data and power may be transmitted between the host apparatus 3100 and the data storage apparatus 3200 through the connection terminal 3250. The connection terminal 3250 may be configured in various forms according to an interfacing method between the host apparatus 3100 and the data storage apparatus 3200. The connection terminal 3250 may be arranged in any one side of the data storage apparatus 3200.

Figure 11:
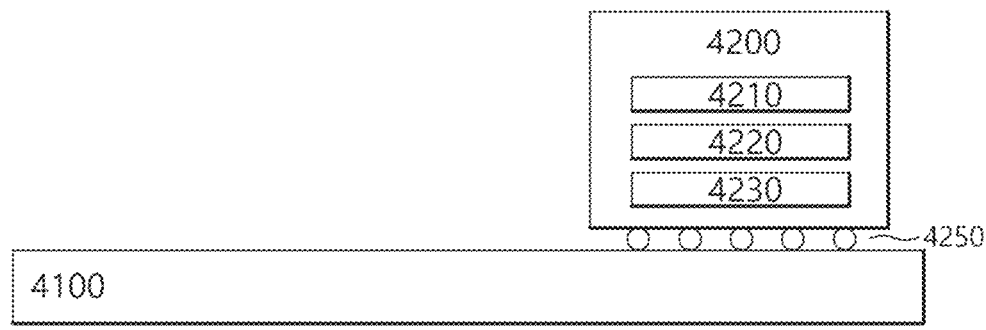
FIG. 11 is a diagram illustrating an example of a data processing system including a data storage apparatus in accordance with an embodiment.

FIG. 11 is a diagram illustrating an example of a data processing system including a data storage apparatus in accordance with an embodiment. Referring to FIG. 11, a data processing system 4000 may include a host apparatus 4100 and a data storage apparatus 4200.

The host apparatus 4100 may be configured in a board form such as a PCB. Although not shown in FIG. 11, the host apparatus 4100 may include internal functional blocks configured to perform functions of the host apparatus 4100.

The data storage apparatus 4200 may be configured in a surface mounting packaging form. The data storage apparatus 4200 may be mounted on the host apparatus 4100 through a solder ball 4250. The data storage apparatus 4200 may include a controller 4210, a buffer memory device 4220, and a nonvolatile memory device 4230.

The controller 4210 may control an overall operation of the data storage apparatus 4200. The controller 4210 may be configured to have the same configuration as the controller 2210 illustrated in FIG. 9.

The buffer memory device 4220 may temporarily store data to be stored in the nonvolatile memory device 4230. The buffer memory device 4220 may temporarily store data read from the nonvolatile memory device 4230. The data temporarily stored in the buffer memory device 4220 may be transmitted to the host apparatus 4100 or the nonvolatile memory device 4230 through control of the controller 4210.

The nonvolatile memory device 4230 may be used as a storage medium of the data storage apparatus 4200.

Figure 12:
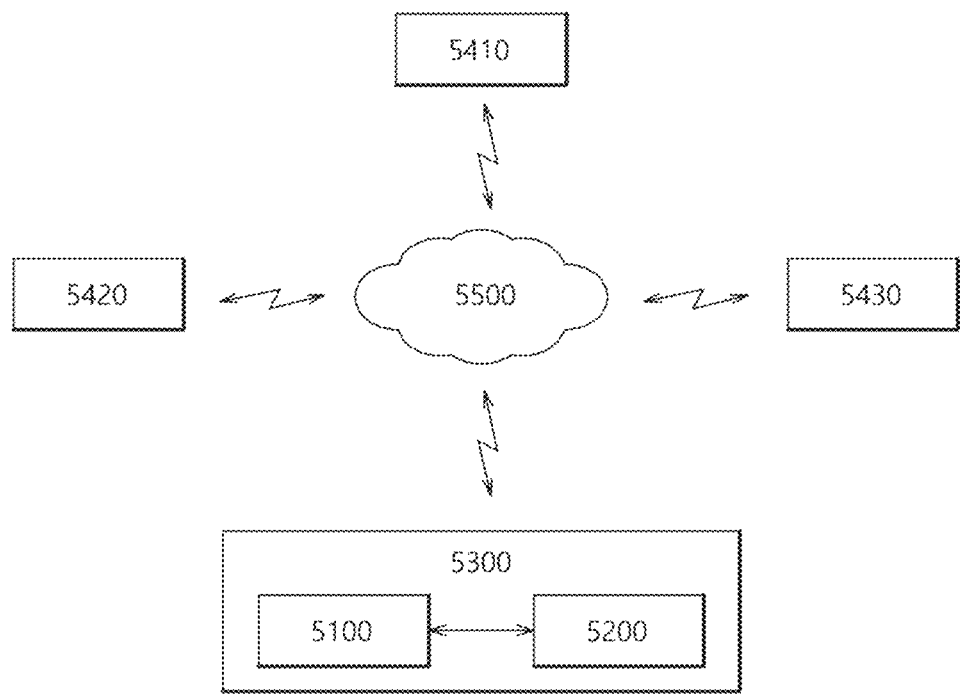
FIG. 12 is a diagram illustrating an example of a network system including a data storage apparatus in accordance with an embodiment.

FIG. 12 is a diagram illustrating an example of a network system 5000 including a data storage apparatus in accordance with an embodiment. Referring to FIG. 12, the network system 5000 may include a server system 5300 and a plurality of client systems 5410 to 5430 which are coupled through a network 5500.

The server system 5300 may serve data in response to requests of the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host apparatus 5100 and a data storage apparatus 5200. The data storage apparatus 5200 may be configured of the data storage apparatus 10 of FIG. 1, the data storage apparatus 2200 of FIG. 8, the data storage apparatus 3200 of FIG. 10, or the data storage apparatus 4200 of FIG. 11.

Figure 13:
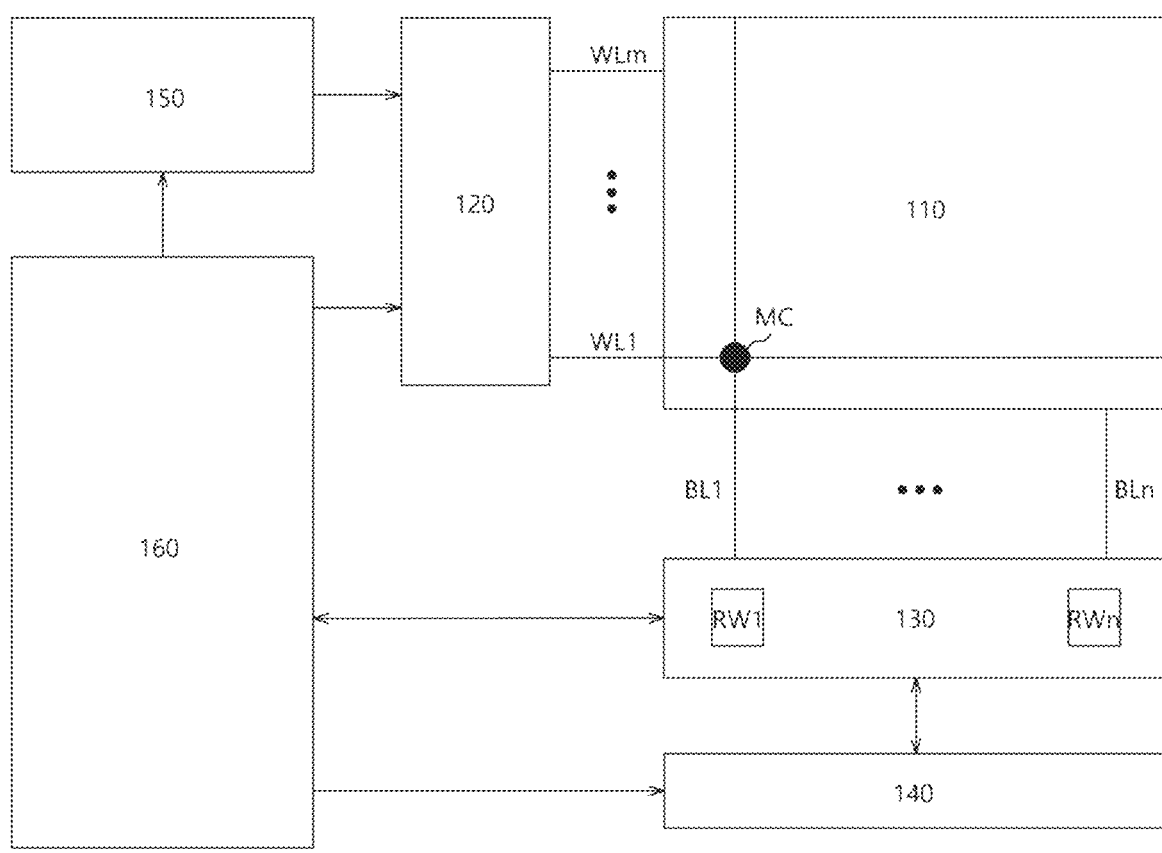
FIG. 13 is a block diagram illustrating an example of a nonvolatile memory device included in a data storage apparatus in accordance with an embodiment.

FIG. 13 is a block diagram illustrating an example of a nonvolatile memory device included in a data storage apparatus in accordance with an embodiment. Referring to FIG. 13, a nonvolatile memory device 100 may include a memory cell array 110, a row decoder 120, a column decoder 140, a data read/write block 130, a voltage generator 150, and a control logic 160.

The memory cell array 110 may include memory cells MC arranged in regions in which word lines WL1 to WLm and bit lines BL1 to BLn cross to each other.

The row decoder 20 may be coupled to the memory cell array 110 through the word lines WL1 to WLm. The row decoder 120 may operate through control of the control logic 160. The row decoder 120 may decode an address provided from an external apparatus (not shown). The row decoder 120 may select and drive the word lines WL1 to WLm based on a decoding result. For example, the row decoder 120 may provide a word line voltage provided from the voltage generator 150 to the word lines WL1 to WLm.

The data read/write block 130 may be coupled to the memory cell array 110 through the bit lines BL1 to BLn. The data read/write block 130 may include read/write circuits RW1 to RWn corresponding to the bit lines BL1 to BLn. The data read/write block 130 may operate according to control of the control logic 160. The data read/write block 130 may operate as a write driver or a sense amplifier according to an operation mode. For example, the data read/write block 130 may operate as the write driver configured to store data provided from an external apparatus in the memory cell array 110 in a write operation. In another example, the data read/write block 130 may operate as the sense amplifier configured to read data from the memory cell array 110 in a read operation.

The column decoder 140 may operate though control of the control logic 160. The column decoder 140 may decode an address provided from an external apparatus (not shown). The column decoder 140 may couple the read/write circuits RW1 to RWn of the data read/write block 130 corresponding to the bit lines BL1 to BLn and data input/output (I/O) lines (or data I/O buffers) based on a decoding result.

The voltage generator 150 may generate voltages used for an internal operation of the nonvolatile memory device 100. The voltages generated through the voltage generator 150 may be applied to the memory cells of the memory cell array 110. For example, a program voltage generated in a program operation may be applied to word lines of memory cells in which the program operation is to be performed. In another example, an erase voltage generated in an erase operation may be applied to well regions of memory cells in which the erase operation is to be performed. In another example, a read voltage generated in a read operation may be applied to word lines of memory cells in which the read operation is to be performed.

The control logic 160 may control an overall operation of the nonvolatile memory device 100 based on a control signal provided from an external apparatus. For example, the control logic 160 may control an operation of the nonvolatile memory device 100 such as a read operation, a write operation, an erase operation of the nonvolatile memory device 100.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A data storage device comprising:
   a nonvolatile memory device including a plurality of dies including a plurality of word line groups in which a plurality of word lines are grouped; and
   a controller configured to control the nonvolatile memory device,
   the controller comprising:
   a word line health rating logic configured to determine a health rating of each word line and a health rating of each word line group based on state information on each of health rating factors associated with the plurality of word lines; and
   a mapping logic configured to generate a management target logical super block by mapping at least one word line group having a lowest health rating among the plurality of word line groups and other word line groups having a health rating higher than the at least one word line group in respective remaining dies other than a die including the at least one word line group, based on the health rating of each word line group.

2. The data storage device according to claim 1, wherein the word line health rating logic determines an average rating of health ratings of word lines included in each word line group, as the health rating of each word line group.

3. The data storage device according to claim 1, wherein the health rating factors include an erase/write cycle for a memory block in which each word line is included, a read pass/fail, a program pass/fail, a number of fail bits and an amount of leakage current for each word line.

4. The data storage device according to claim 1, wherein the controller generates XOR parity for data to be stored in the management target logical super block and ECC parity of the data, when performing a write operation for the management target logical super block, and controls the nonvolatile memory device to store the generated XOR parity in a word line selected among word lines included in the management target logical super block.

5. The data storage device according to claim 1, wherein the mapping logic generates a normal logical super block by mapping word line groups having intermediate health ratings in the respective dies, based on the health rating of each word line group.

6. The data storage device according to claim 5, wherein the controller does not generate XOR parity for data to be stored in the normal logical super block and ECC parity of the data, when performing a write operation for the normal logical super block, and controls the nonvolatile memory device to store only the data and the ECC parity of the data in the normal logical super block.

7. The data storage device according to claim 1, wherein the mapping logic generates a management target super word line by mapping some of word lines included in the management target logical super block, based on the health rating of each word line, and
   wherein only one-word line among the word lines included in the management target super word line has a lowest health rating.

8. The data storage device according to claim 7, wherein the word lines of the management target super word line further include word lines having health ratings higher than a health rating of the one-word line.

9. The data storage device according to claim 7, wherein each of the word lines included in the management target super word line corresponds to each of the plurality of dies.

10. A method for operating a data storage device including a nonvolatile memory device including a plurality of dies including a plurality of word line groups in which a plurality of word lines are grouped, the method comprising:
    determining a health rating of each word line and a health rating of each word line group based on state information on each of health rating factors associated with the plurality of word lines; and
    generating a management target logical super block by mapping at least one word line group having a lowest health rating among the plurality of word line groups and other word line groups having a health rating higher than the at least one word line group in respective remaining dies other than a die including the at least one word line group, based on the health rating of each word line group.

11. The method according to claim 10, further comprising:
    generating XOR parity for data to be stored in the management target logical super block and ECC parity of the data, when a write request for the management target logical super block is received; and
    storing the data, the ECC parity and the XOR parity in the management target logical super block.

12. The method according to claim 10, further comprising:
    generating a normal logical super block by mapping word line groups having intermediate health ratings in the respective dies, based on the health rating of each word line groups.

13. The method according to claim 12, further comprising:
    storing data and ECC parity of the data in the normal logical super block, when a write request for the normal logical super block is received.

14. The method according to claim 10, further comprising:
    generating a management target super word line by mapping some of word lines included in the management target logical super block, based on the health rating of each word line,
    wherein only one-word line among the word lines included in the management target super word line has a lowest health rating.

15. The method according to claim 14, wherein the generating of the management target super word line includes mapping the one-word line having the lowest health rating and word lines having health ratings higher than a health rating of the one-word line.

16. The method according to claim 10, wherein the health rating of each word line group is determined as an average rating of health ratings of corresponding word lines.

17. The method according to claim 10, wherein the health rating factors include an erase/write cycle for a memory block in which each word line is included, a read pass/fail, a program pass/fail, a number of fail bits and an amount of leakage current for each word line.

\* \* \* \* \*